United States Patent
Ishikawa et al.

(10) Patent No.: US 11,012,031 B2
(45) Date of Patent: May 18, 2021

(54) OSCILLATOR, ELECTRONIC DEVICE, AND VEHICLE

(71) Applicant: SEIKO EPSON CORPORATION, Tokyo (JP)

(72) Inventors: Masayuki Ishikawa, Suwa (JP); Naoki Ii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/773,694

(22) Filed: Jan. 27, 2020

(65) Prior Publication Data

US 2020/0244221 A1  Jul. 30, 2020

(30) Foreign Application Priority Data

Jan. 29, 2019 (JP) .............................. JP2019-013421

(51) Int. Cl.
| | |
|---|---|
| H03B 5/04 | (2006.01) |
| H03B 5/36 | (2006.01) |
| H03L 1/02 | (2006.01) |
| H03L 5/00 | (2006.01) |
| H03B 5/32 | (2006.01) |

(52) U.S. Cl.
CPC ............... *H03B 5/04* (2013.01); *H03B 5/32* (2013.01); *H03B 5/364* (2013.01); *H03B 5/366* (2013.01); *H03L 1/022* (2013.01); *H03L 5/00* (2013.01)

(58) Field of Classification Search
CPC .. H03B 5/04; H03B 5/364; H03F 3/45; H03L 1/02; H03L 1/022; H03L 1/04
See application file for complete search history.

(56) References Cited

U.S. PATENT DOCUMENTS

| | | | |
|---|---|---|---|
| 2015/0180410 A1 | 6/2015 | Yamamoto | |
| 2017/0040942 A1* | 2/2017 | Isohata | ................... H03L 1/022 |
| 2017/0346442 A1* | 11/2017 | Ito | ......................... H01L 41/042 |

FOREIGN PATENT DOCUMENTS

| | | |
|---|---|---|
| JP | H11-127032 | 5/1999 |
| JP | 2013-150032 | 8/2013 |
| JP | 2013-162358 | 8/2013 |
| JP | 2013162358 A * | 8/2013 |
| JP | 2014-155184 | 8/2014 |
| JP | 2015-126286 | 7/2015 |

* cited by examiner

*Primary Examiner* — Ryan Johnson
(74) *Attorney, Agent, or Firm* — Workman Nydegger

(57) ABSTRACT

An oscillator includes a resonator and an integrated circuit, the integrated circuit includes an oscillation circuit that oscillates the resonator, a temperature sensor, a temperature compensation circuit that compensates for temperature characteristics of the resonator based on an output signal of the temperature sensor, an output circuit that receives a signal output from the oscillation circuit and outputs an oscillation signal, and a heat generating circuit, and in the heat generating circuit, a current flows in a first period after supply of a power supply voltage from the outside is started to generate heat and no current flows in the second period after the first period ends.

9 Claims, 15 Drawing Sheets

OSCILLATOR, ELECTRONIC DEVICE, AND VEHICLE

The present application is based on, and claims priority from JP Application Serial Number 2019-013421, filed Jan. 29, 2019, the disclosure of which is hereby incorporated by reference herein in its entirety.

BACKGROUND

1. Technical Field

The present disclosure relates to an oscillator, an electronic device, and a vehicle.

2. Related Art

In JP-A-2015-126286, a temperature compensated oscillator capable of adjusting a temperature compensation circuit in a state close to that during normal operation by allowing a current equivalent to a current flowing through an output circuit during normal operation to flow through a heat generating circuit because the output circuit stops operating when the temperature compensation circuit is adjusted.

In general, when a power supply voltage is applied to a temperature compensated oscillator, an integrated circuit that oscillates a resonator operates to generate heat and the heat is transmitted to the resonator, so that the temperature compensated oscillator enters a thermal equilibrium state in which the heat of the integrated circuit and the heat of the resonator are stable. In the temperature compensated oscillator described in JP-A-2015-126286, a frequency deviation can be reduced by performing temperature compensation in such a thermal equilibrium state. However, immediately after the oscillator is started, the integrated circuit becomes a heat generation source, and thus temperature of the resonator changes with a delay following a temperature change of the integrated circuit. That is, when the oscillator is started, thermal equilibrium may be lost because the temperature change of the resonator occurs with a delay with respect to the temperature change of the temperature sensor provided in the integrated circuit and the frequency deviation may increase due to the frequency of the oscillation signal deviating from the frequency in the thermal equilibrium state.

SUMMARY

An oscillator according to an aspect of the present disclosure includes a resonator and an integrated circuit, in which the integrated circuit includes an oscillation circuit that oscillates the resonator, a temperature sensor, a temperature compensation circuit that compensates for temperature characteristics of the resonator based on an output signal of the temperature sensor, an output circuit that receives a signal output from the oscillation circuit and outputs an oscillation signal, and a heat generating circuit, and in the heat generating circuit, a current flows in a first period after supply of a power supply voltage from the outside is started to generate heat and no current flows in a second period after the first period ends.

In the oscillator according to the aspect, the output circuit may stop operating in the first period and operate in the second period and power consumed by the heat generating circuit per unit time in the first period may be larger than power consumed by the output circuit per unit time in the second period.

In the oscillator according to the aspect, the current flowing through the heat generating circuit in the first period may be variable.

In the oscillator according to the aspect, a length of the first period may be variable.

In the oscillator according to the aspect, the integrated circuit may include an amplitude detection circuit that detects an amplitude of the signal output from the oscillation circuit and outputs a detection signal, and the first period may be set based on the detection signal.

In the oscillator according to the aspect, the integrated circuit may include a plurality of external connection terminals including a first external connection terminal electrically coupled to one end of the resonator and a second external connection terminal electrically coupled to the other end of the resonator, and, among the plurality of external connection terminals, the first external connection terminal or the second external connection terminal may be closest to the heat generating circuit.

In the oscillator according to the aspect, among the plurality of external connection terminals, the first external connection terminal or the second external connection terminal may be farthest from the temperature sensor.

An oscillator according to another aspect of the present disclosure includes a resonator and an integrated circuit, in which the integrated circuit generates heat with a first heat generation amount per unit time in a first period after supply of a power supply voltage from the outside is started, and generates heat with a second heat generation amount per unit time in a second period after the first period ends, and the first heat generation amount is larger than the second heat generation amount.

An electronic device according to another aspect of the present disclosure includes the oscillator according to the aspect.

A vehicle according to another aspect of the present disclosure includes the oscillator according to the aspect.

DESCRIPTION OF EXEMPLARY EMBODIMENTS

Hereinafter, exemplary embodiments of the present disclosure will be described in detail with reference to the drawings. The embodiments described below do not unduly limit contents of the present disclosure described in the claims. Also, not all of the configurations described below are essential constituent requirements of the present disclosure.

1. Oscillator

1-1. First Embodiment

Figure 1:
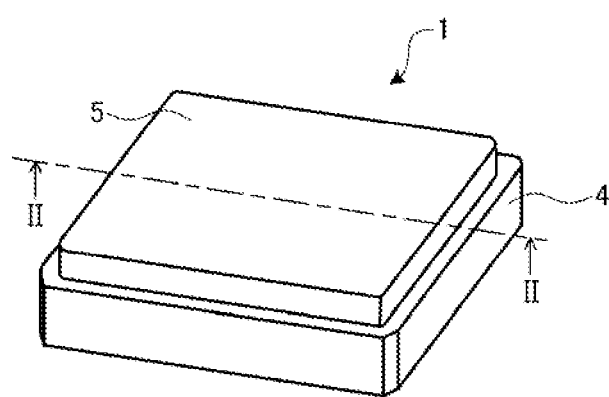
FIG. 1 is a perspective view of an oscillator according to an embodiment of the present disclosure.
Figure 2:
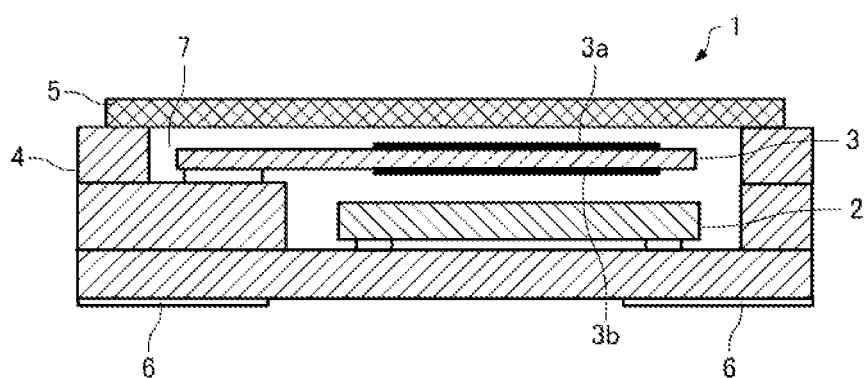
FIG. 2 is cross-sectional view of the oscillator according to the embodiment of the present disclosure.

FIGS. 1 and 2 are diagrams illustrating an example of a structure of an oscillator 1 of the embodiment of the present disclosure. FIG. 1 is a perspective view of the oscillator 1 and FIG. 2 is a cross-sectional view taken along line II-II of FIG. 1.

The oscillator 1 of the embodiment of the present disclosure is a temperature compensated oscillator, and as illustrated in FIGS. 1 and 2, the oscillator 1 includes an integrated circuit 2, a resonator 3, a package 4, a lid 5, and a plurality of external terminals 6. In the embodiment of the present disclosure, the resonator 3 is a quartz crystal resonator using quartz crystal as a substrate material, and is, for example, an AT cut quartz crystal resonator, a tuning fork type quartz crystal resonator, or the like. The resonator 3 may be a surface acoustic wave (SAW) resonator or a micro electromechanical systems (MEMS) resonator. As the substrate material of the resonator 3, in addition to quartz crystal, piezoelectric single crystals such as lithium tantalate and lithium niobate, piezoelectric materials such as piezoelectric ceramics such as lead zirconate titanate, or silicon semiconductor materials can be used. As an excitation unit of the resonator 3, one using a piezoelectric effect may be used, or electrostatic drive using a Coulomb force may be used. The integrated circuit 2 is a circuit that oscillates the resonator 3 and outputs an oscillation signal.

The package 4 accommodates the integrated circuit 2 and the resonator 3 in the same space. Specifically, the package 4 is provided with a recess, and the recess is covered with the lid 5 to form an accommodation chamber 7. On the inside of the package 4 or the surface of the recess, wirings (not illustrated) for electrically coupling two terminals of the integrated circuit 2, specifically, an XI terminal and an XO terminal in FIG. 3 to be described later, and two excitation electrodes 3a and 3b of the resonator 3, respectively, are provided. On the inside of the package 4 or the surface of the recess, wiring (not illustrated) for electrically coupling each terminal of the integrated circuit 2 and each external terminal 6 provided on the bottom surface of the package 4 is provided. The package 4 is not limited to a configuration in which the integrated circuit 2 and the resonator 3 are accommodated in the same space. For example, a so-called H-type package in which the integrated circuit 2 is mounted on one surface of a package substrate and the resonator 3 is mounted on the other surface thereof may be used.

The resonator 3 includes metal excitation electrodes 3a and 3b on the front and back surfaces thereof, respectively, and oscillates at a desired frequency according to the shape and mass of the resonator 3 including the excitation electrodes 3a and 3b.

Figure 3:
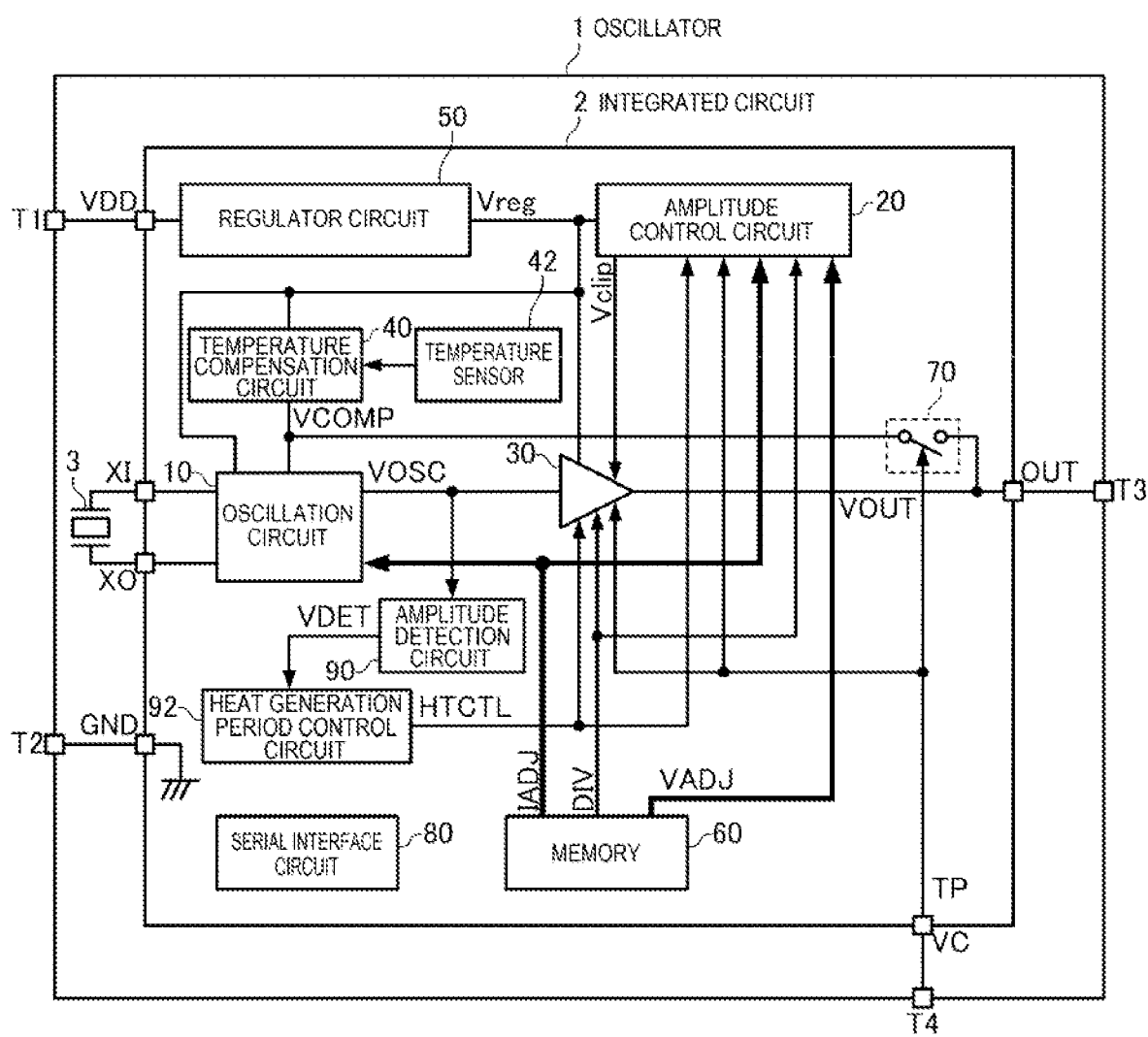
FIG. 3 is a functional block diagram of an oscillator according to a first embodiment.

FIG. 3 is a functional block diagram of the oscillator 1 according to the first embodiment. As illustrated in FIG. 3, the oscillator 1 of the first embodiment includes the integrated circuit 2 and the resonator 3. The integrated circuit 2 includes a VDD terminal, a GND terminal, an OUT terminal, a VC terminal, the XI terminal, and the XO terminal as external connection terminals. The VDD terminal, the GND terminal, the OUT terminal, and the VC terminal are electrically coupled to T1 to T4 terminals, which are the plurality of external terminals 6 of the oscillator 1 illustrated in FIG. 2, respectively. The XI terminal is electrically coupled to one end of the resonator 3 and the terminal XO terminal is electrically coupled to the other end of the resonator 3.

In this embodiment, the integrated circuit 2 includes an oscillation circuit 10, an amplitude control circuit 20, an output circuit 30, a temperature compensation circuit 40, a temperature sensor 42, a regulator circuit 50, a memory 60, a switch circuit 70, a serial interface circuit 80, an amplitude detection circuit 90, and a heat generation period control circuit 92. The integrated circuit 2 of this embodiment may have a configuration in which some of these elements are omitted or changed, or other elements are added.

The oscillation circuit 10 is a circuit that oscillates the resonator 3, and amplifies an output signal of the resonator 3 and feeds the output signal back to the resonator 3. The oscillation circuit 10 outputs an oscillation signal VOSC based on oscillation of the resonator 3.

The temperature sensor 42 detects the temperature of the integrated circuit 2 and outputs a temperature signal having a voltage corresponding to the temperature, and is realized by, for example, a circuit using temperature characteristics of a band gap reference circuit.

The temperature compensation circuit 40 is a circuit that compensates for the temperature characteristics of the resonator 3 based on the output signal of the temperature sensor 42. In this embodiment, the temperature compensation circuit 40 generates a temperature compensation voltage VCOMP based on the temperature signal output from the temperature sensor 42 and a coefficient value corresponding to frequency-temperature characteristics of the resonator 3 stored in the memory 60. The temperature compensation voltage VCOMP is applied to one end of a variable capacitance element (not illustrated) that functions as a load capacitance of the oscillation circuit 10 to control the oscillation frequency. The temperature compensation circuit 40 is a circuit that compensates for the temperature characteristics of the resonator 3 by converting the frequency of the oscillation signal VOSC output from the oscillation circuit 10 according to the temperature characteristics of the resonator 3. Such a circuit is realized by, for example, a fractional N-PLL circuit.

The output circuit 30 receives the oscillation signal VOSC, which is a signal output from the oscillation circuit 10, as an input and outputs an oscillation signal VOUT. For example, when the oscillator 1 is used as an oscillator for GPS used in a cellular or the like, a high frequency-temperature compensation accuracy of, for example, ±0.5 ppm is required. Therefore, in this embodiment, the regulator circuit 50 stabilizes an output voltage amplitude of the output circuit 30, and from the viewpoint of reducing current consumption, the output circuit 30 outputs the oscillation signal VOUT having a clipped sine waveform with the output amplitude suppressed.

The amplitude control circuit 20 is a circuit for controlling the amplitude of the oscillation signal VOUT output from the output circuit 30.

The regulator circuit 50 generates a constant voltage Vreg as a power supply voltage or a reference voltage for the oscillation circuit 10, the temperature compensation circuit 40, the output circuit 30, and the like, based on a power supply voltage supplied from the VDD terminal.

The memory 60 includes a register (not illustrated) and a non-volatile memory such as a metal oxide nitride oxide silicon (MONOS) type memory or an electrically erasable programmable read-only memory (EEPROM), and is configured to be able to perform read and write for the non-volatile memory or the register through the serial interface circuit 80 from the external terminal 6 of the oscillator 1. In this embodiment, since the integrated circuit 2 coupled to the external terminal 6 of the oscillator 1 has only four terminals of VDD, GND, OUT, and VC, for example, when the voltage at the VDD terminal is higher than a threshold value, the serial interface circuit 80 may receive a clock signal externally input from the VC terminal and a data signal externally input from the OUT terminal, and may perform read and write of data for a non-volatile memory or internal register (not illustrated). The serial interface circuit 80 may be, for example, an interface circuit of a 2-wire bus such as an inter-integrated circuit (I2C) bus, or may be an interface circuit of a 3-wire bus such as a serial peripheral interface (SPI) bus or a 4-wire bus.

The switch circuit 70 is a circuit for switching electrical connection between the temperature compensation circuit 40 and the OUT terminal that is electrically coupled to an output side of the output circuit 30.

In this embodiment, in an inspection process before shipment of the oscillator 1, a low-level or high-level test signal TP can be input to the VC terminal, and after the inspection process is completed, the VC terminal is grounded and the test signal TP is fixed at the low level. When the test signal TP input to the VC terminal is at the low level, the switch circuit 70 does not electrically couple the temperature compensation circuit 40 and the OUT terminal, and the oscillation signal VOUT output from the output circuit 30 is output to the OUT terminal. When the test signal TP is at the high level, the switch circuit 70 electrically couples the temperature compensation circuit 40 and the OUT terminal, output of the oscillation signal VOUT from the output circuit 30 is stopped, and the temperature compensation voltage VCOMP is output to the OUT terminal.

The memory 60 stores oscillation stage current adjustment data IADJ for adjusting and selecting an oscillation stage current of the oscillation circuit 10 in accordance with the frequency of the resonator 3. The memory 60 stores frequency division switching data DIV for selecting whether or not to divide and output the oscillation signal VOSC by a frequency dividing circuit provided inside the output circuit 30. The memory 60 also stores output level adjustment data VADJ for adjusting an amplitude level of the oscillation signal VOUT of clipped sine wave output from the output circuit 30.

These data are stored in the non-volatile memory included in the memory 60 in the manufacturing process of the oscillator 1. In the manufacturing process of the oscillator 1, coefficient values such as zero-order, first order, third order (not illustrated) corresponding to the frequency-temperature characteristics of the resonator 3 are also stored in the non-volatile memory. Each data stored in the non-volatile memory is written from the non-volatile memory to each register immediately after the start of the oscillator 1, that is, immediately after the supply of the power supply voltage to the VDD terminal is started.

The amplitude detection circuit 90 detects the amplitude of the oscillation signal VOSC, which is a signal output from the oscillation circuit 10, and outputs a detection signal VDET. In this embodiment, the detection signal VDET is at a low level when the amplitude of the oscillation signal VOSC is smaller than a predetermined threshold, and is at a high level when the amplitude of the oscillation signal VOSC is larger than the predetermined threshold.

The heat generation period control circuit 92 outputs a heat generation control signal HTCTL based on the detection signal VDET output from the amplitude detection circuit 90. In this embodiment, when the detection signal VDET is at a low level, the heat generation control signal HTCTL is at a low level. The heat generation control signal HTCTL changes from the low level to the high level in synchronization with the timing when the detection signal VDET changes from the low level to the high level. That is, a period during which the heat generation control signal HTCTL is at the low level is set based on the detection signal VDET. For example, the heat generation control signal HTCTL may change from the low level to the high level immediately after the detection signal VDET changes from the low level to the high level, or the heat generation control signal HTCTL may change from the low level to the high level when a predetermined time elapses from the timing when the detection signal VDET changes from the low level to the high level. Immediately after the oscillator 1 is started, the amplitude of the oscillation signal VOSC is smaller than the threshold value, and thus the detection signal VDET is at the low level, and the heat generation control signal HTCTL is also at the low level. Thereafter, when the amplitude of the oscillation signal VOSC becomes larger than the threshold value, the detection signal VDET changes from the low level to the high level, and as a result, the heat generation control signal HTCTL also changes from the low level to the high level.

As will be described later, the amplitude control circuit 20 includes a heat generating circuit, and heat generation of the heat generating circuit is controlled based on the heat generation control signal HTCTL and the test signal TP. In this embodiment, the heat generating circuit is controlled to generate heat when the heat generation control signal HTCTL is at the low level or when the test signal is at the high level.

Configuration of Oscillation Circuit

Figure 4:
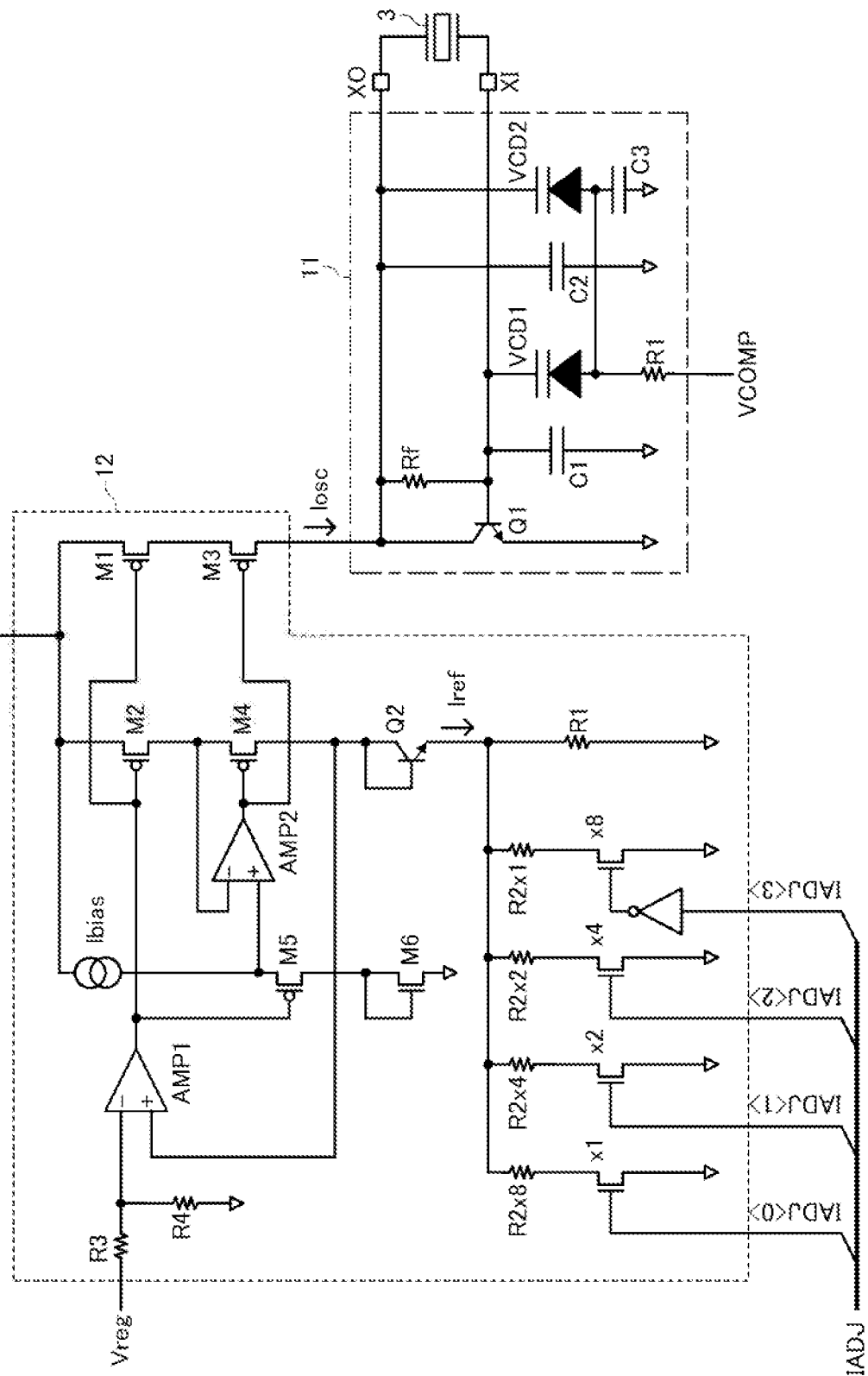
FIG. 4 is a diagram illustrating a configuration example of an oscillation circuit.

FIG. 4 is a diagram illustrating a configuration example of the oscillation circuit 10 of FIG. 3. In FIG. 4, although the oscillation stage current adjustment data IADJ is 4 bits, but may be 2 bits or less, or 5 bits or more. As illustrated in FIG. 4, the oscillation circuit 10 includes an oscillation unit 11 and a current source circuit 12. The oscillation unit 11 is coupled to the resonator 3 to constitute a Pierce-type oscillation circuit. In the oscillation unit 11, varicap diodes VCD1 and VCD2 which are variable capacitance elements are connected in series with each other and in parallel with the resonator 3, a capacitance value of the oscillation unit 11 is changed with respect to the temperature by applying the temperature compensation voltage VCOMP to the varicap diodes VCD1 and VCD2, and the oscillation signal VOSC in which the frequency-temperature characteristics of the resonator 3 is compensated is output.

The current source circuit 12 generates a current Iref serving as a reference for an oscillation stage current Iosc by a current adjustment unit in which a differential amplifier AMP1, a PMOS transistor M2, a bipolar transistor Q2, a resistor R1, and a plurality of resistors R2 are connected in parallel. The reference current Iref is adjusted by the oscillation stage current adjustment data IADJ. A size of a gate width of the PMOS transistor M1 and a size of a gate width of the PMOS transistor M2 have a ratio of 10:1, for example. A size of a gate width of a PMOS transistor M3 and a size of a gate width of a PMOS transistor M4 have the same size ratio. For example, when Iref=20 μA, 200 μA, which is 10 times Iref, is supplied to the oscillation unit 11 as the oscillation stage current Iosc. The circuit configured by a differential amplifier AMP2, the PMOS transistor M4, a current source for supplying a bias current Ibias, and PMOS transistors M5 and M6 is a circuit for further suppressing power supply dependence of the oscillation stage current Iosc flowing through the cascode-connected PMOS transistors M1 and M3. This circuit is a gain enhanced cascode circuit that further reduces the power source dependence of the current output from the current source compared to the cascode circuit in a TCXO that requires high frequency accuracy. This cascode circuit monitors a source voltage of the PMOS transistor M4 on a reference side and, controls gate voltages of the PMOS transistors M3 and M4 by the differential amplifier AMP2 when the power supply voltage supplied from the VDD terminal fluctuates to further suppress change in potential difference between the source and drain of the PMOS transistors M1 and M2. Output resistance of the current source circuit 12 further increases by a gain multiple of the differential amplifier AMP2. The oscillation stage current Iosc is stabilized against fluctuations in the power supply voltage, and fluctuations in the oscillation frequency of the oscillation unit 11 can be suppressed.

Configuration of Output Circuit

Figure 5:
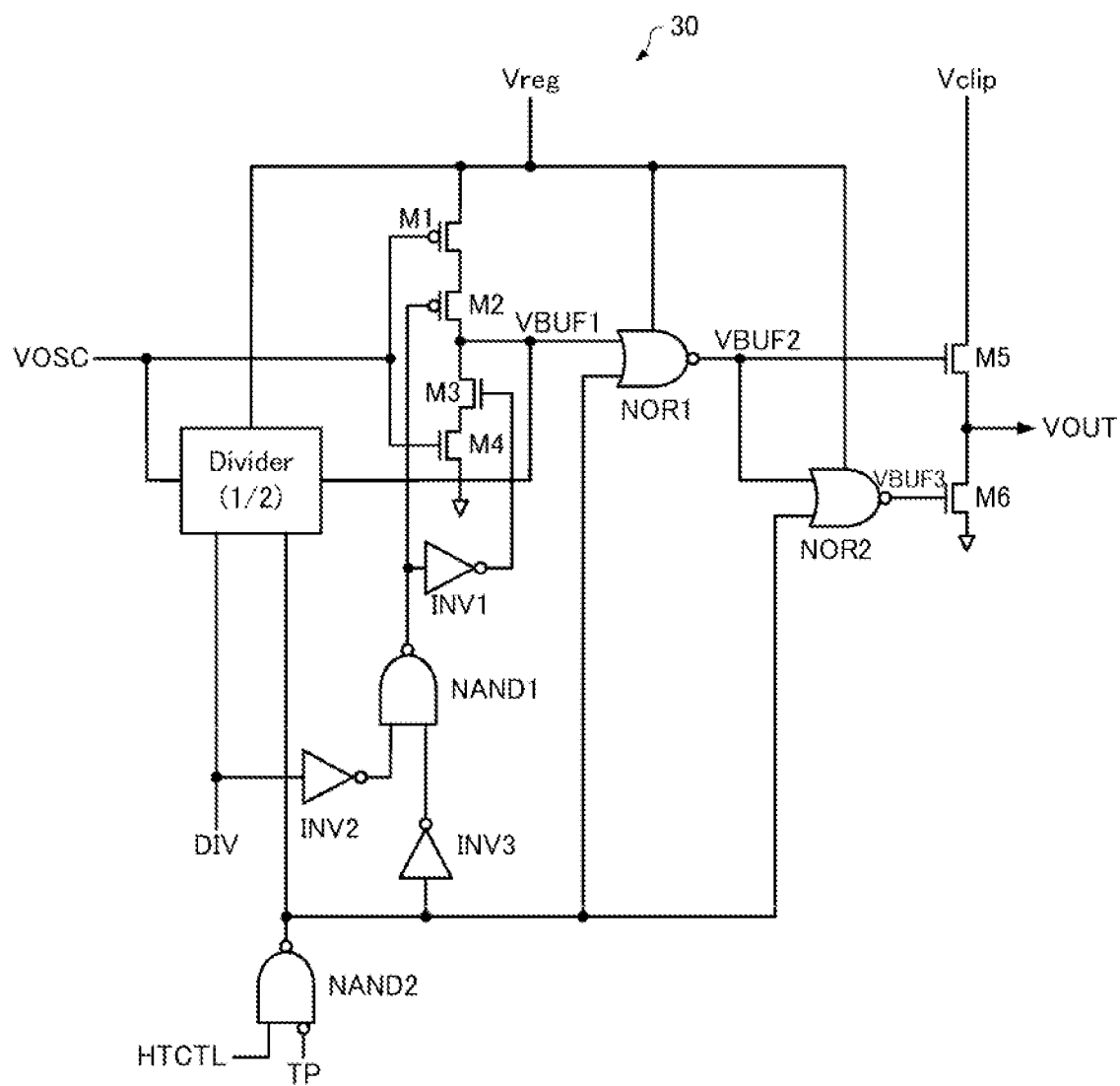
FIG. 5 is a diagram illustrating a configuration example of an output circuit.

FIG. 5 is a diagram illustrating a configuration example of the output circuit 30 in FIG. 3. As illustrated in FIG. 5, the output circuit 30 is supplied with the output voltage Vreg of the regulator circuit 50 and a clip voltage Vclip for obtaining the clipped sine wave output generated by the amplitude control circuit 20. The output circuit 30 includes a frequency dividing circuit, and is configured to be able to select whether or not to divide the oscillation signal VOSC output from the oscillation circuit 10 by two, based on a value of the frequency division switching data DIV. In this embodiment, when the value of the frequency division switching data DIV is 0, the oscillation signal VOSC is not frequency-divided, the polarity thereof is inverted by an inverter configured by the MOS transistors M1 to M4, and a signal at a node VBUF1 is transmitted to a NOR circuit NOR1. On the other hand, when the value of the frequency division switching data DIV is 1, the oscillation signal VOSC is divided to ½ by the frequency dividing circuit, and the signal of the node VBUF1 is transmitted to the NOR circuit NOR1.

As described above, since the heat generation control signal HTCTL is at the low level immediately after the oscillator 1 is started, the MOS transistors M2 and M3 are turned off, an output node VBUF2 of the NOR circuit NOR1 and an output node VBUF3 of a NOR circuit NOR2 are both set to the ground potential, and the NMOS transistors M5 and M6 are both turned off. As a result, the output circuit 30 enters an operation stop state. Thereafter, when the heat generation control signal HTCTL changes from the low level to the high level, the output circuit 30 becomes operable, and the oscillation signal VOSC is clipped at a voltage amplitude level determined by the clip voltage Vclip and is output as the oscillation signal VOUT.

In the manufacturing process of the oscillator 1, when adjusting the temperature compensation circuit 40 of FIG. 3, the test signal TP is set to the high level. With this configuration, the MOS transistors M2 and M3 are turned off, the output node VBUF2 of the NOR circuit NOR1 and the output node VBUF3 of the NOR circuit NOR2 are both set to the ground potential, and the NMOS transistors M5 and M6 are both turned off. As a result, the output circuit 30 enters an operation stop state.

Configuration of Amplitude Control Circuit

Figure 6:
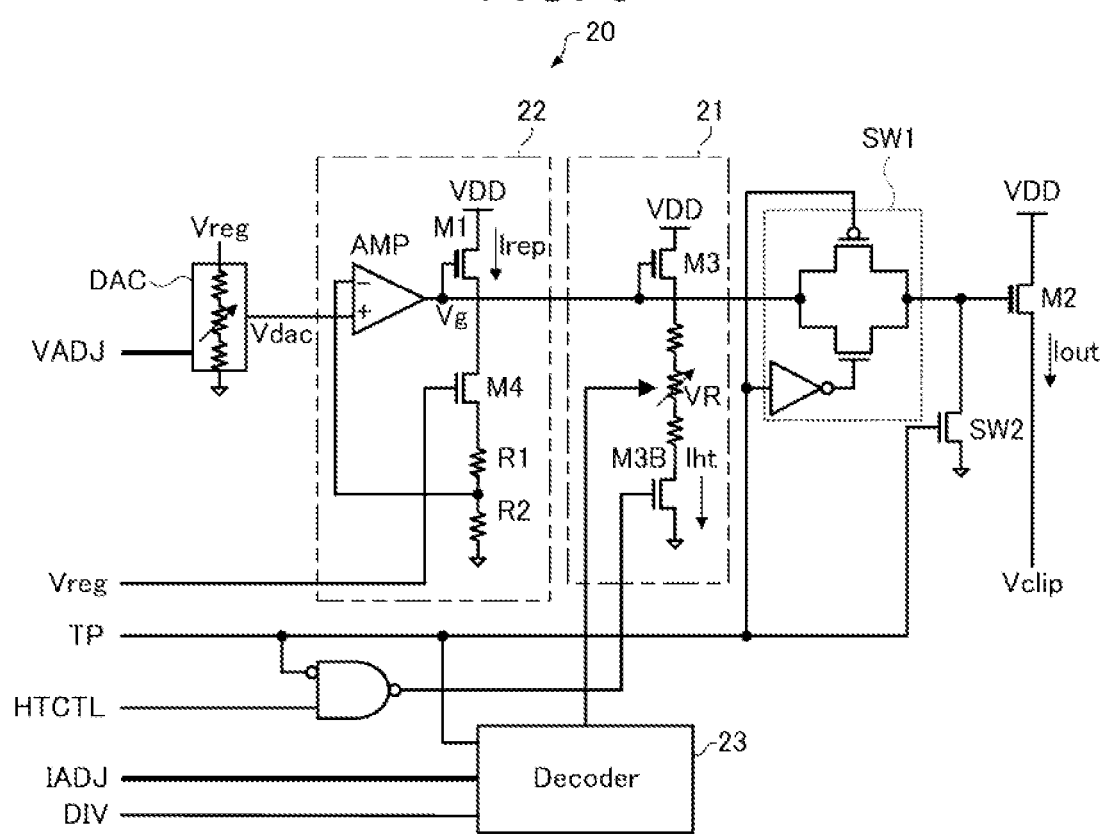
FIG. 6 is a diagram illustrating a configuration example of an amplitude control circuit.

FIG. 6 is a diagram illustrating a configuration example of the amplitude control circuit 20 in FIG. 3. As illustrated in FIG. 6, the amplitude control circuit 20 includes a heat generating circuit 21, a replica circuit 22, and a decoder 23. In FIG. 6, NMOS transistors M1, M2, and M3 are depletion-type MOS transistors, and the other MOS transistors are enhancement-type MOS transistors.

As represented in the following expression (1), the clip voltage Vclip that determines an output amplitude level of the output circuit 30 is a voltage obtained by subtracting a gate-source voltage $Vgs_{M2}$ of the MOS transistor M2 from the output voltage Vg of the differential amplifier AMP included in the replica circuit 22.

$$Vclip = Vg - Vgs_{M2} \quad (1)$$

The output voltage Vg of the differential amplifier AMP is obtained from an analog voltage Vdac D/A converted by a D/A converter DAC based on data given by the output level adjustment data VADJ by the following expression (2).

$$Vg = Vdac \cdot \left(\frac{R1}{R2} + 1\right) + Vgs_{M1} \quad (2)$$

By substituting the expression (2) into the expression (1), a relationship of the following expression (3) is established. That is, the clip voltage Vclip is determined by Vdac·(R1/R2+1), which is a voltage obtained by amplifying the output voltage Vdac of the D/A converter DAC by the differential amplifier AMP.

$$Vclip + Vgs_{M2} = Vdac \cdot \left(\frac{R1}{R2} + 1\right) + Vgs_{M1} \quad (3)$$

As described above, the waveform of the oscillation signal VOUT output from the output circuit 30 is a clipped sine wave, and the peak value of the clipped sine wave decreases as the output frequency increases, and thus the output level adjustment data VADJ corresponding to the output frequency is stored in the memory 60.

Since the test signal TP is fixed at a low level in the shipped oscillator 1, a switch circuit SW1 is in an on state and an NMOS switch SW2 is in an off state. With this configuration, the amplitude control circuit 20 enters an operating state, and outputs the clip voltage Vclip represented by the expression (1).

Immediately after the oscillator 1 is started, the heat generation control signal HTCTL is at the low level, and thus a MOS transistor M3B included in the heat generating circuit 21 is turned on and the heat generating circuit 21 enters an operating state. With this configuration, a direct current Iht flows through the heat generating circuit 21 to generate heat. Thereafter, when the heat generation control signal HTCTL changes from the low level to the high level, the MOS transistor M3B changes from the on state to the off state, and the heat generating circuit 21 enters an operation stop state. As such above, in this embodiment, the heat generating circuit 21 generates heat immediately after the start of the oscillator 1, and the generated heat is transmitted to the resonator 3 through the XI terminal and the XO terminal, so that temperature rise of the resonator 3 is accelerated, and then the heat generating circuit 21 stops heat generation and the temperature rise of the resonator 3 is suppressed. With this configuration, the time required to reach a thermal equilibrium state in which the temperature of the integrated circuit 2 and the temperature of the resonator 3 coincide with each other can be shortened.

On the other hand, in the manufacturing process of the oscillator 1, when the temperature compensation circuit 40 is adjusted, the test signal TP is set to a high level. For that reason, the switch circuit SW1 is turned off, the NMOS switch SW2 is turned on, and the NMOS transistor M2 enters a cut-off state. The MOS transistor M3B is turned on, and the heat generating circuit 21 enters an operating state.

The decoder 23 controls the direct current Iht flowing through the heat generating circuit 21 based on the test signal TP, the oscillation stage current adjustment data IADJ, and the frequency division switching data DIV. Specifically, when the test signal TP is at the high level, the decoder 23 controls a resistance value of the variable resistor VR according to the oscillation stage current adjustment data IADJ and the frequency division switching data DIV. With this configuration, the current Iht flowing through the heat generating circuit 21 when the test signal TP is at the high level changes in conjunction with the value of the oscillation stage current adjustment data IADJ, the value of the frequency division switching data DIV, and the value of the output level adjustment data VADJ and approaches a current corresponding to the current consumed by the output circuit 30 when the test signal TP is at the low level. As a result, a difference between the consumption current of the integrated circuit 2 when the test signal TP is at the low level and the consumption current of the integrated circuit 2 when the test signal TP is at the high level is reduced. That is, the difference between the current consumption of the integrated circuit 2 when the output circuit 30 is in the operating state and the current consumption of the integrated circuit 2 when the output circuit 30 is in the stopped state is reduced.

When the test signal TP is at the low level, the decoder 23 controls the variable resistor VR included in the heat generating circuit 21 to a predetermined resistance value. The greater the resistance value of the variable resistor VR, the greater the DC current Iht that flows through the heat generating circuit 21 when the heat generation control signal HTCTL is at the low level. The resistance value of the variable resistor VR may be set so that the time required for the integrated circuit 2 and the resonator 3 to reach the thermal equilibrium state is as short as possible. When the test signal TP is at the low level, the variable resistor VR is controlled to a predetermined resistance value regardless of the logic level of the heat generation control signal HTCTL, but when the heat generation control signal HTCTL is at the high level, the direct current Iht does not flow through the heat generating circuit 21.

Relationship Between Temperature of Integrated Circuit and Resonator

The oscillator 1 of this embodiment can shorten the time required for the integrated circuit 2 and the resonator 3 to reach a thermal equilibrium state by causing the direct current Iht to flow through the heat generating circuit 21 immediately after the start, compared to the oscillator of the comparative example in which the direct current Iht does not flow through the heat generating circuit 21.

Figure 7:
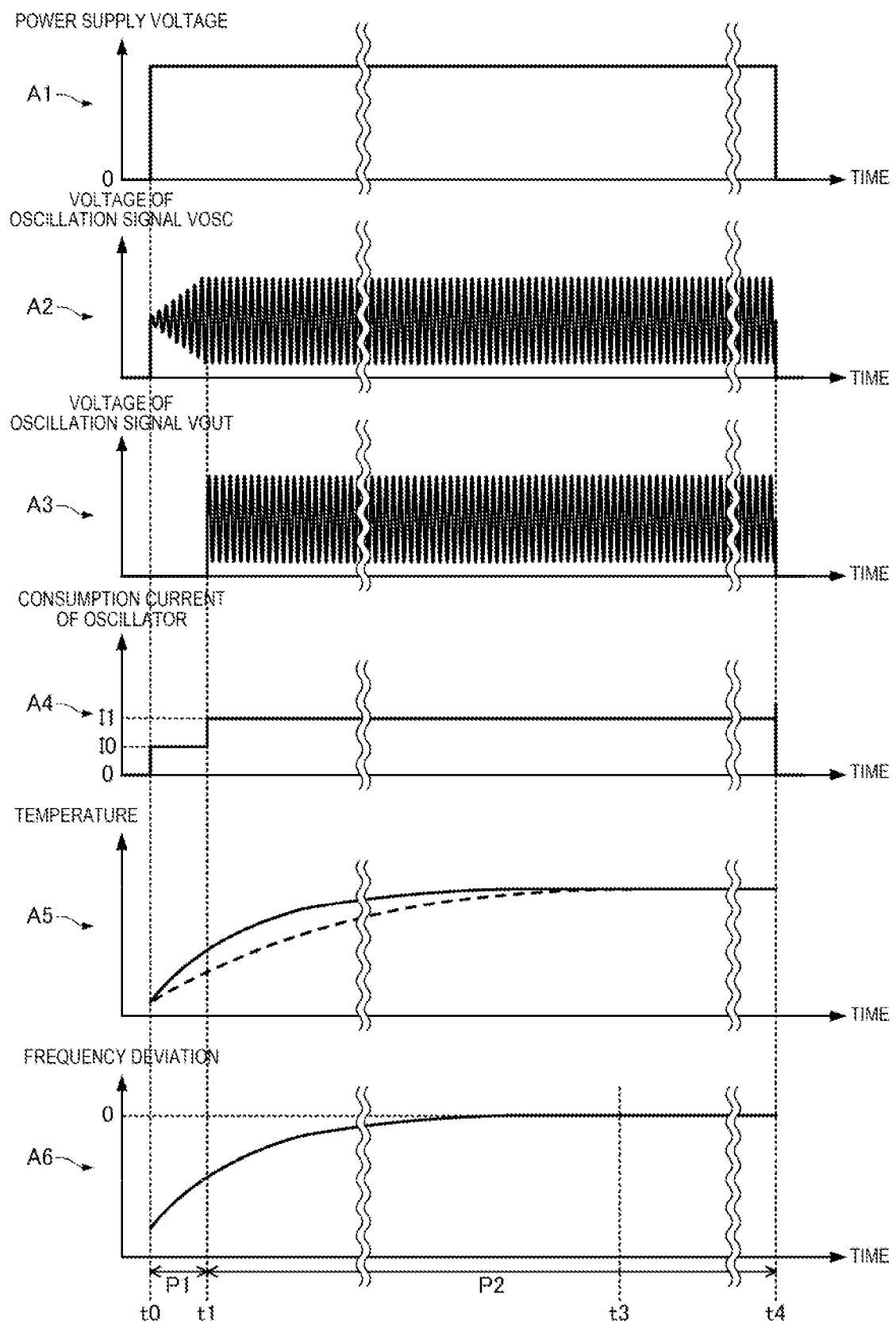
FIG. 7 is a diagram illustrating an example of an operation of an oscillator of a comparative example.
Figure 8:
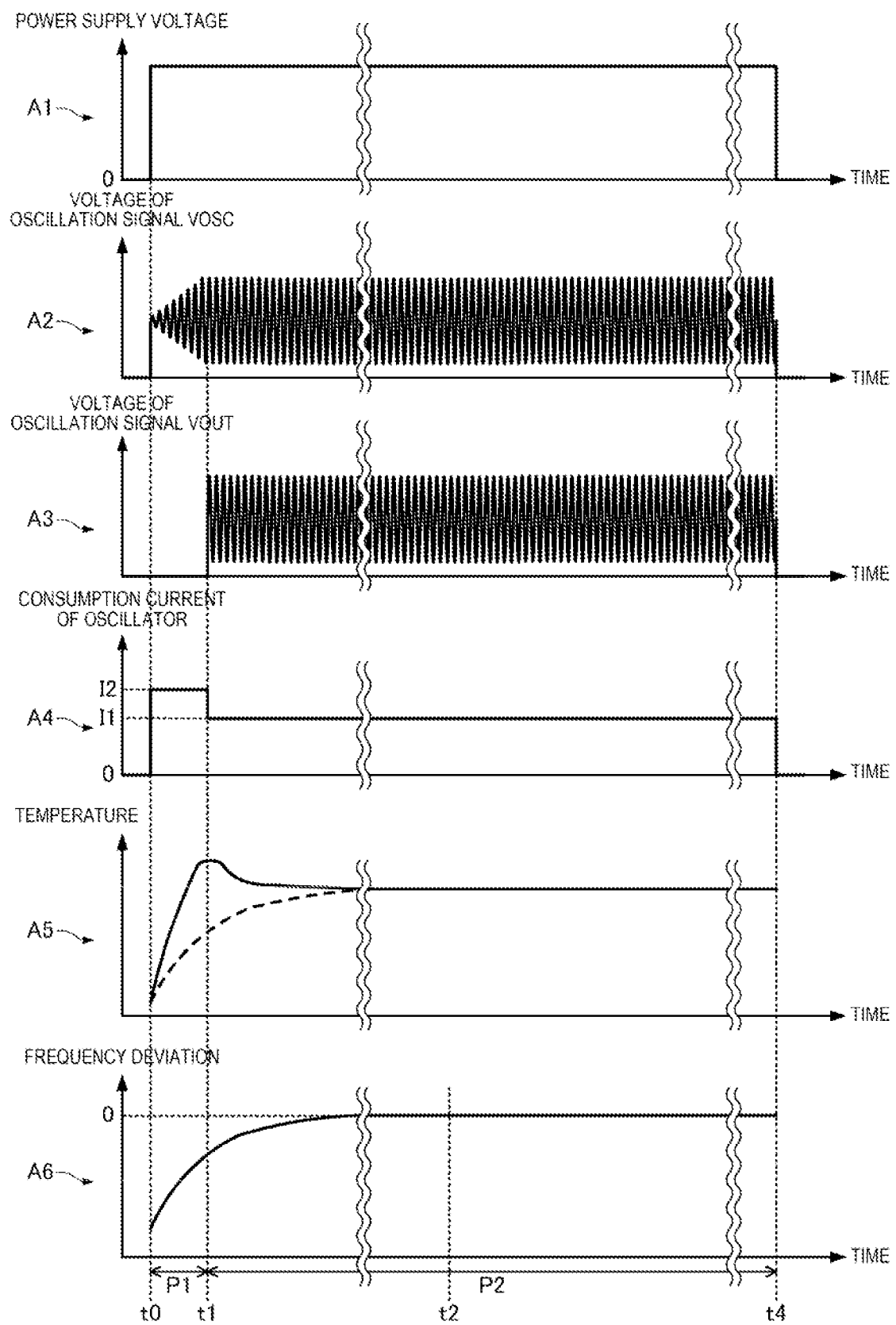
FIG. 8 is a diagram illustrating an example of an operation of the oscillator according to the first embodiment.

FIG. 7 is a diagram illustrating an example of the operation of the oscillator of the comparative example. FIG. 8 is a diagram illustrating an example of the operation of the oscillator 1 of this embodiment. In FIGS. 7 and 8, A1 indicates a change in the power supply voltage supplied to the VDD terminal, A2 indicates a waveform of the oscillation signal VOSC, and A3 indicates a waveform of the oscillation signal VOUT. A4 indicates power consumption of the integrated circuit 2, A5 indicates temperature of the integrated circuit 2 and the temperature of the resonator 3, and A6 indicates frequency deviation of the oscillation frequency. In A5, the solid line represents the temperature change of the integrated circuit 2, and the broken line represents the temperature change of the resonator 3.

As indicated by A1 in FIGS. 7 and 8, when the supply of the power supply voltage to the VDD terminal is started at time t0, the resonator 3 oscillates and the amplitude of the oscillation signal VOSC gradually increases, as indicated by A2. When the amplitude of the oscillation signal VOSC becomes larger than the threshold value, the oscillation signal VOUT is generated at time t1, as indicated by A3. Thereafter, the supply of the power supply voltage to the VDD terminal is completed at time t4, and the operation of the oscillator 1 is stopped.

In the oscillator of the comparative example, as indicated by A4 in FIG. 7, in a first period P1 from time t0 to time t1, the output circuit 30 stops its operating, and thus a consumption current is I0, whereas in a second period P2 from time t1 to time t4, the output circuit 30 operates, and thus the consumption current becomes I1 larger than I0. For that reason, the amount of heat generated in the first period P1 is smaller than the amount of heat generated in the second period P2, and as indicated by A5, the temperature of the integrated circuit 2 rises slowly and the temperature of the resonator 3 also rises gradually following the temperature of the integrated circuit 2. Then, at time t3 in the second period P2, the integrated circuit 2 and the resonator 3 reach a thermal equilibrium state, and the oscillation frequency deviation becomes substantially zero as indicated by A6.

In contrast, in the oscillator 1 according to this embodiment, in the first period P1 after the supply of the power supply voltage from the outside is started, a current flows through the heat generating circuit 21 to generate heat and no current flows in the second period P2 after the first period P1 ends. The first period P1 is a period during which the heat generation control signal HTCTL is at the low level, and is set based on the detection signal VDET output from the amplitude detection circuit 90 as described above. Although the output circuit 30 stops operating in the first period P1 and operates in the second period P2, in this embodiment, the power consumed by the heat generating circuit 21 per unit time in the first period P1 is larger than the power consumed by the output circuit 30 per unit time in the second period P2. Accordingly, as indicated by A4 in FIG. 8, a consumption current I2 in the first period P1 is larger than the consumption current I1 in the second period P2. As a result, the integrated circuit 2 generates heat with a first heat generation amount per unit time in the first period P1, generates heat with a second heat generation amount per unit time in the second period P2 after the first period P1 ends, and the first heat generation amount is larger than the second heat generation amount. For that reason, in the first period P1, the temperature of the integrated circuit 2 rises sharply, and the temperature of the resonator 3 also rises sharply following the temperature of the integrated circuit 2. Then, at time t2 earlier than time t3 of the second period P2, the integrated circuit 2 and the resonator 3 reach a thermal equilibrium state and the deviation of the oscillation frequency becomes substantially zero, as indicated by A6. As such, in the oscillator 1 of this embodiment, the time until the integrated circuit 2 and the resonator 3 reach the thermal equilibrium state is shortened compared to the oscillator of the comparative example.

In the oscillator 1 of this embodiment, even if the power consumed by the heat generating circuit 21 per unit time in the first period P1 is smaller than the power consumed by the output circuit 30 per unit time in the second period P2, since the consumption current I0 in the first period P1 is larger than that of the oscillator of the comparative example, the time until the integrated circuit 2 and the resonator 3 reach a thermal equilibrium state is shortened.

Layout of Integrated Circuit

Figure 9:
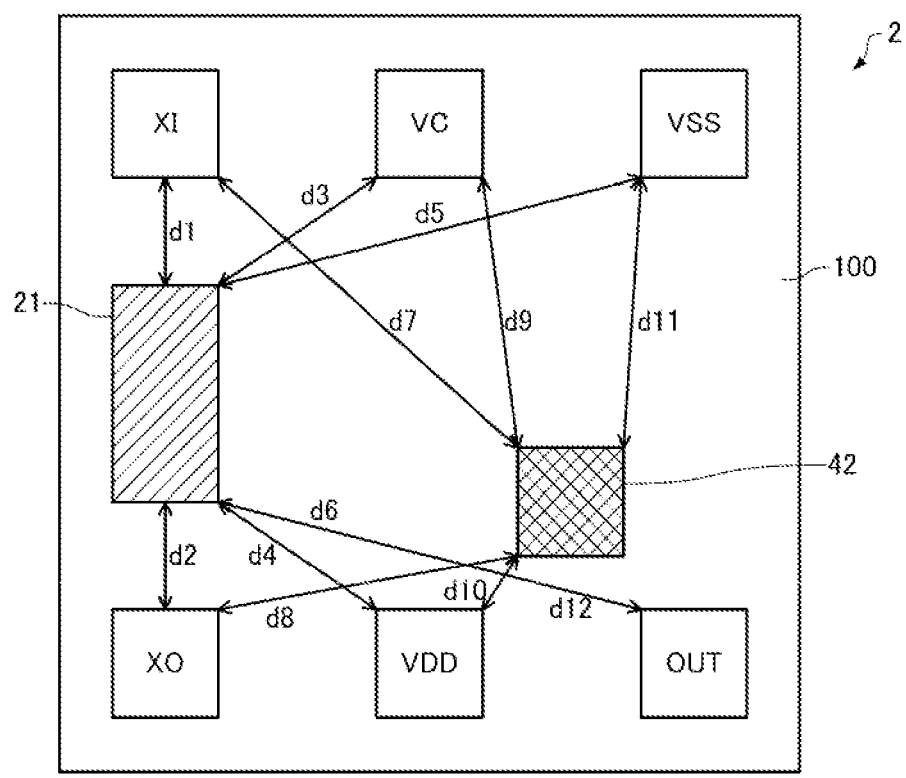
FIG. 9 is a plan view of a semiconductor substrate of an integrated circuit.

In this embodiment, a layout of the integrated circuit 2 is devised so that heat generated by the integrated circuit 2 is easily transmitted to the resonator 3. FIG. 9 is a plan view of a semiconductor substrate 100 on which elements are formed in the integrated circuit 2. As illustrated in FIG. 9, in this embodiment, the shortest distance d1 between the heat generating circuit 21 and the XI terminal is shorter than the shortest distance d3 between the heat generating circuit 21 and the VC terminal, the shortest distance d4 between the heat generating circuit 21 and the VDD terminal, the shortest distance d5 between the heat generating circuit 21 and the VSS terminal, and the shortest distance d6 between the heat generating circuit 21 and the OUT terminal. Similarly, the shortest distance d2 between the heat generating circuit 21 and the XO terminal is shorter than the shortest distance d3 between the heat generating circuit 21 and the VC terminal, the shortest distance d4 between the heat generating circuit 21 and the VDD terminal, the shortest distance d5 between the heat generating circuit 21 and the VSS terminal, and the shortest distance d6 between the heat generating circuit 21 and the OUT terminal. That is, the heat generating circuit 21 has the shortest distance from the XI terminal or the XO terminal among the plurality of external connection terminals of the integrated circuit 2. In other words, among the plurality of external connection terminals of the integrated circuit 2, the XI terminal or the XO terminal is closest to the heat generating circuit 21. Accordingly, the heat generated by the heat generating circuit 21 is efficiently transmitted to the resonator 3 through the XI terminal and the XO terminal, the temperature rise of the resonator 3 is accelerated, and the time until the integrated circuit 2 and the resonator 3 reach a thermal equilibrium state is shortened.

As illustrated in FIG. 9, in this embodiment, the shortest distance d7 between the temperature sensor 42 and the XI terminal is longer than the shortest distance d9 between the temperature sensor 42 and the VC terminal, the shortest distance d10 between the temperature sensor 42 and the VDD terminal, and the shortest distance d11 between the temperature sensor 42 and the VSS terminal, and the shortest distance d12 between the temperature sensor 42 and the OUT terminal. Similarly, the shortest distance d8 between the temperature sensor 42 and the XO terminal is longer than the shortest distance d9 between the temperature sensor 42 and the VC terminal, the shortest distance d10 between the temperature sensor 42 and the VDD terminal, the shortest distance d11 between the temperature sensor 42 and the VSS terminal, and the shortest distance d12 between the temperature sensor 42 and the OUT terminal. That is, the temperature sensor 42 has the longest distance from the XI terminal or the XO terminal among the plurality of external connection terminals of the integrated circuit 2. In other words, among the plurality of external connection terminals of the integrated circuit 2, the XI terminal or the XO terminal is farthest from the temperature sensor 42. Accordingly, since the temperature sensor 42 is away from the heat generating circuit 21, the temperature sensor 42 detects a temperature lower than the temperature of the heat generating circuit 21, and thus the difference between the temperature detected by the temperature sensor 42 and the temperature of the resonator 3 is reduced and the frequency deviation when the output of the oscillation signal VOSC is started can be reduced.

The shortest distance d1 between the heat generating circuit 21 and the XI terminal is smaller than the shortest distance d7 between the temperature sensor 42 and the XI terminal. Similarly, the shortest distance d2 between the heat generating circuit 21 and the XO terminal is smaller than the shortest distance d8 between the temperature sensor 42 and the XO terminal. Accordingly, the heat generated by the heat generating circuit 21 is more easily transmitted to the resonator 3 through the XI terminal and the XO terminal than the temperature sensor 42, and thus the difference between the temperature detected by the temperature sensor 42 and the temperature of the resonator 3 is reduced.

The XI terminal is an example of a "first external connection terminal", and the XO terminal is an example of a "second external connection terminal".

Operational Effects

As described above, in the oscillator 1 of the first embodiment, since the heat generating circuit 21 generates heat during the first period P1 from the start, power consumption of the integrated circuit 2 in the second period P2 is larger than the power consumption of the integrated circuit 2 in the second period P2 after the first period P1, in the integrated circuit 2. As a result, the heat generation amount of the integrated circuit 2 in the first period P1 becomes larger than the heat generation amount of the integrated circuit 2 in the second period P2, and the heat from the integrated circuit 2 is efficiently transmitted to the resonator 3. For that reason, the temperature rise of the resonator 3 is accelerated, the time until the integrated circuit 2 and the resonator 3 reach a thermal equilibrium state is shortened, and the frequency deviation when the output of the oscillation signal VOSC is started is reduced. Accordingly, according to the oscillator 1 of the first embodiment, it is possible to reduce the frequency deviation of the oscillation signal at the time of start.

Also, according to the oscillator 1 of the first embodiment, when the temperature compensation circuit 40 is adjusted, the current flowing through the heat generating circuit 21 can be changed in conjunction with the oscillation stage current adjustment data, the output level adjustment data VADJ, and the frequency division switching data DIV to accurately generate the current corresponding to the current consumed by the output circuit 30 during normal operation, and thus frequency temperature compensation can be performed with high accuracy by reducing the differential current. In the oscillator 1 of the first embodiment, a circuit area of the integrated circuit 2 is reduced by using the heat generating circuit 21 in the first period P1 and at the time of adjusting the temperature compensation circuit 40.

1-2. Second Embodiment

Hereinafter, for the oscillator 1 of a second embodiment, the same reference numerals are given to the same configurations as those of the first embodiment, the description similar to the first embodiment is omitted or simplified, and the contents different from the first embodiment will be mainly described.

Figure 10:
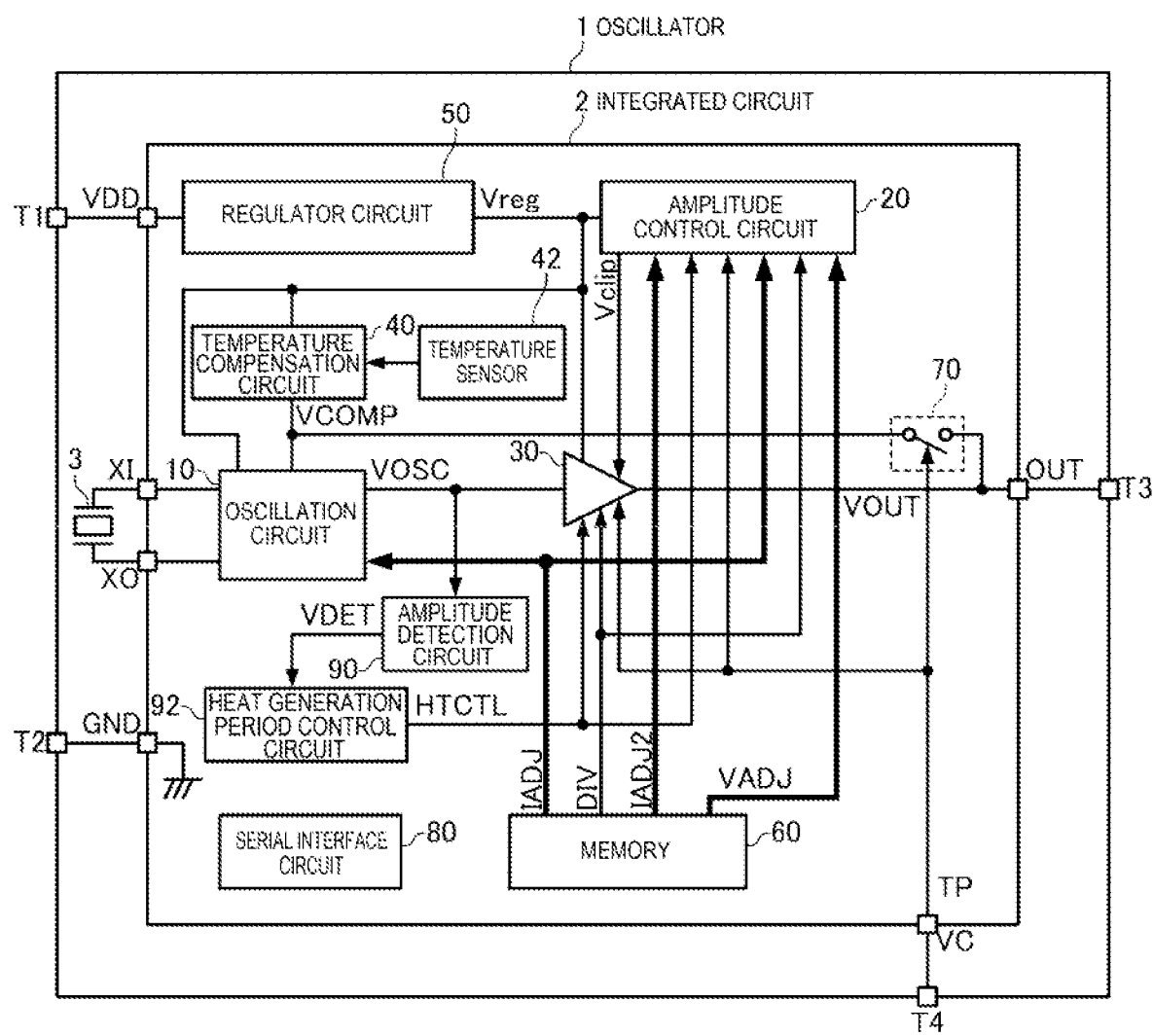
FIG. 10 is a functional block diagram of an oscillator according to a second embodiment.

FIG. 10 is a functional block diagram of the oscillator 1 according to the second embodiment. As illustrated in FIG. 10, in the oscillator 1 according to the second embodiment, heat generation control current adjustment data IADJ2 for adjusting and selecting the current flowing through the heat generating circuit 21 in the first period P1 is stored in the memory 60 of the integrated circuit 2. The heat generation control current adjustment data IADJ2 is stored in a non-volatile memory included in the memory 60 in the manufacturing process of the oscillator 1. The heat generation control current adjustment data IADJ2 stored in the non-volatile memory is written from the non-volatile memory to the register immediately after the start of the oscillator 1, that is, immediately after the supply of the power supply voltage to the VDD terminal is started.

The amplitude control circuit 20 adjusts and selects the current that flows through the heat generating circuit 21 in the first period P1 based on the heat generation control current adjustment data IADJ2.

Figure 11:
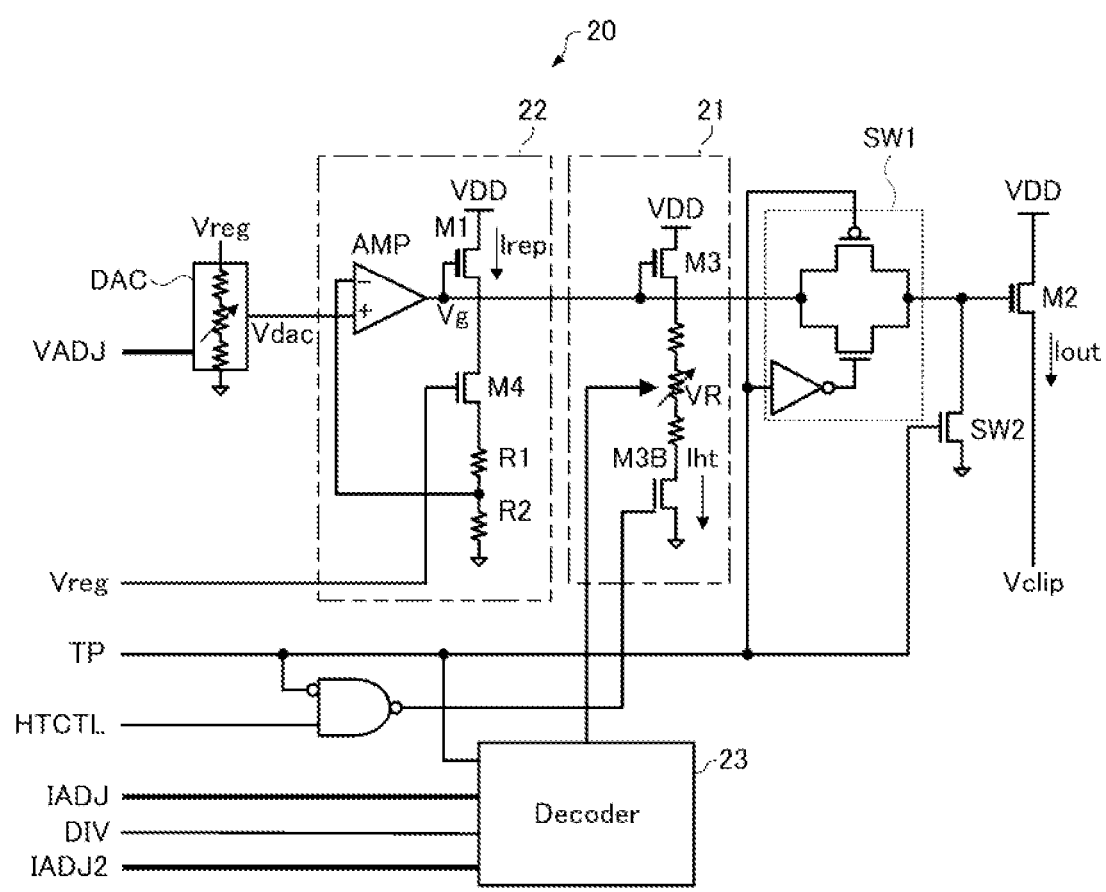
FIG. 11 is a diagram illustrating a configuration example of an amplitude control circuit.

FIG. 11 is a diagram illustrating a configuration example of the amplitude control circuit 20 of FIG. 10. As illustrated in FIG. 11, in the amplitude control circuit 20, the decoder 23 controls the direct current Iht flowing through the heat generating circuit 21 based on the test signal TP, the oscillation stage current adjustment data IADJ, the frequency division switching data DIV, and the heat generation control current adjustment data IADJ2. Specifically, when the test signal TP is at the high level, the decoder 23 controls the resistance value of the variable resistor VR according to the oscillation stage current adjustment data IADJ and the frequency division switching data DIV, similarly as in the first embodiment.

When the test signal TP is at the low level, the decoder 23 controls the variable resistor VR included in the heat generating circuit 21 to a value corresponding to the heat generation control current adjustment data IADJ2 in the first period P1 when the heat generation control signal HTCTL is at the low level. Then, the direct current Iht corresponding to the resistance value of the variable resistor VR flows through the heat generating circuit 21. That is, in the oscillator 1 of the second embodiment, the current flowing through the heat generating circuit 21 in the first period P1 is variable.

Figure 12:
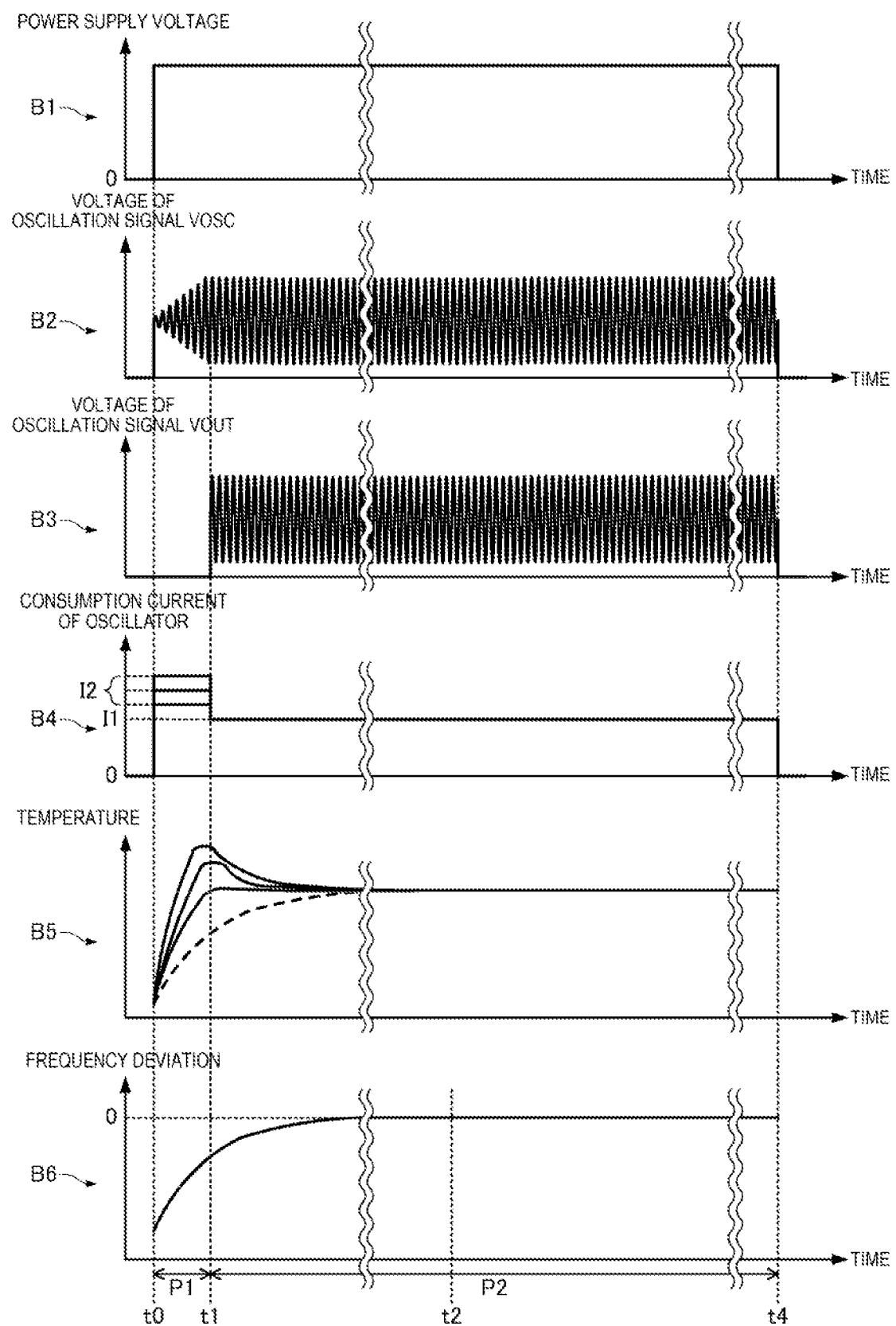
FIG. 12 is a diagram illustrating an example of an operation of the oscillator according to the second embodiment.

FIG. 12 is a diagram illustrating an example of the operation of the oscillator 1 according to the second embodiment. In FIG. 12, B1 indicates the change in the power supply voltage supplied to the VDD terminal, B2 indicates the waveform of the oscillation signal VOSC, and B3 indicates the waveform of the oscillation signal VOUT. B4 indicates the power consumption of the integrated circuit 2, B5 indicates the temperature of the integrated circuit 2 and the temperature of the resonator 3, and B6 indicates the frequency deviation of the oscillation frequency. In B5, the solid line represents the temperature change of the integrated circuit 2, and the broken line represents the temperature change of the resonator 3.

As illustrated by B1 in FIG. 12, when the supply of the power supply voltage to the VDD terminal is started at time t0, the resonator 3 oscillates and the amplitude of the oscillation signal VOSC gradually increases, as indicated by B2. When the amplitude of the oscillation signal VOSC becomes larger than the threshold value, the oscillation signal VOUT is generated at time t1, as indicated by B3.

Thereafter, the supply of the power supply voltage to the VDD terminal is completed at time t4, and the operation of the oscillator 1 is stopped.

In the oscillator 1 of the second embodiment, the current corresponding to the heat generation control current adjustment data IADJ2 flows through the heat generating circuit 21 to generate heat in the first period P1, and no current flows in the second period P2 after the first period P1 ends. That is, in this embodiment, the consumption current I2 in the first period P1 can be adjusted, as indicated by B4. Although the output circuit 30 stops operating in the first period P1 and operates in the second period P2, in this embodiment, the power consumed by the heat generating circuit 21 per unit time in the first period P1 is larger than the power consumed by the output circuit 30 per unit time in the second period P2. Accordingly, as indicated by B4, the consumption current I2 in the first period P1 is larger than the consumption current I1 in the second period P2. As a result, the integrated circuit 2 generates heat with a first heat generation amount per unit time in the first period P1, generates heat with a second heat generation amount per unit time in the second period P2 after the first period P1 ends, and the first heat generation amount is larger than the second heat generation amount. For that reason, in the first period P1, the temperature of the integrated circuit 2 rises sharply, and the temperature of the resonator 3 also rises sharply following the temperature of the integrated circuit 2. Then, at time t2 of the second period P2, the integrated circuit 2 and the resonator 3 reach a thermal equilibrium state and the deviation of the oscillation frequency becomes substantially zero, as indicated by B6. As such, according to the oscillator 1 of the second embodiment, similarly as in the first embodiment, the time until the integrated circuit 2 and the resonator 3 reach the thermal equilibrium state is shortened compared to the oscillator of the comparative example described above. Furthermore, according to the oscillator 1 of the second embodiment, since the current flowing through the heat generating circuit 21 in the first period P1 can be adjusted according to an individual difference of the oscillator 1, even if there is an individual difference of the oscillator 1, the time until the integrated circuit 2 and the resonator 3 reach a thermal equilibrium state can be reliably shortened.

1-3. Third Embodiment

Hereinafter, for the oscillator 1 of a third embodiment, the same reference numerals are given to the same configurations as those of the first embodiment, the description similar to the first embodiment is omitted or simplified, and the contents different from the first embodiment will be mainly described.

Figure 13:
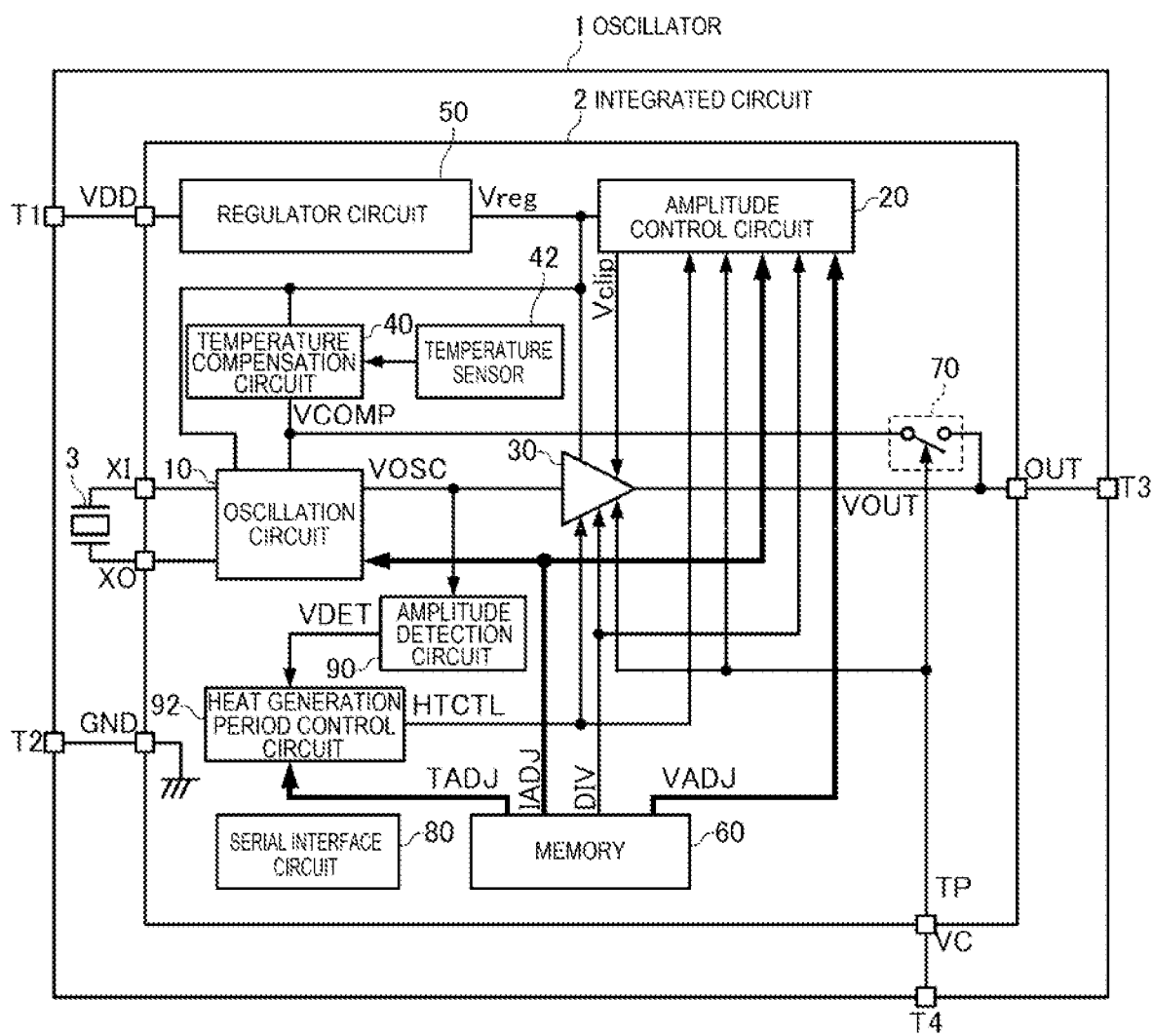
FIG. 13 is a functional block diagram of an oscillator of a third embodiment.

FIG. 13 is a functional block diagram of the oscillator 1 according to the third embodiment. As illustrated in FIG. 13, in the oscillator 1 according to the third embodiment, heat generation period adjustment data TADJ for adjusting and selecting the length of the first period P1 during which the current flows through the heat generating circuit 21 is stored in the memory 60 of the integrated circuit 2. The heat generation period adjustment data TADJ is stored in a non-volatile memory included in the memory 60 in the manufacturing process of the oscillator 1. The heat generation period adjustment data TADJ stored in the non-volatile memory is written from the non-volatile memory to the register immediately after the start of the oscillator 1, that is, immediately after the supply of the power supply voltage to the VDD terminal is started.

The heat generation period control circuit 92 outputs the heat generation control signal HTCTL based on the detection signal VDET output from the amplitude detection circuit 90 and the heat generation period adjustment data TADJ. In this embodiment, when the detection signal VDET is at the low level, the heat generation control signal HTCTL is at the low level. When the time set according to the heat generation period adjustment data TADJ elapses from the timing when the detection signal VDET changes from the low level to the high level, the heat generation control signal HTCTL changes from the low level to the high level. Specifically, the heat generation period control circuit 92 counts the number of pulses of the oscillation signal VOSC from the timing when the detection signal VDET changes from the low level to the high level, and changes the heat generation control signal HTCTL from the low level to the high level when the count value corresponding to the heat generation period adjustment data TADJ is reached. As such, in the oscillator 1 according to the third embodiment, the length of the first period P1 is variable.

Figure 14:
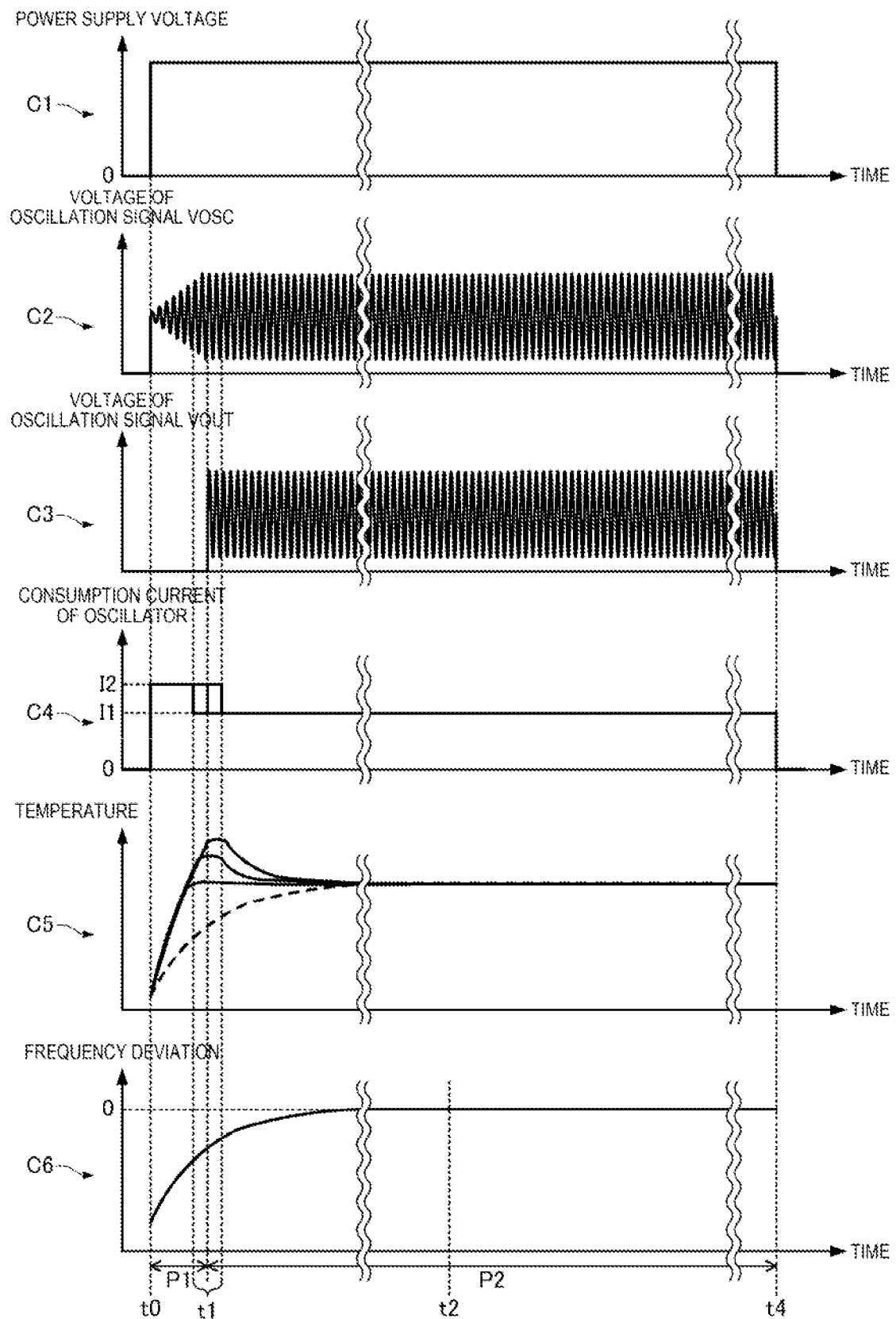
FIG. 14 is a diagram illustrating an example of an operation of the oscillator according to the third embodiment.

FIG. 14 is a diagram illustrating an example of the operation of the oscillator 1 according to the third embodiment. In FIG. 14, C1 indicates the change in the power supply voltage supplied to the VDD terminal, C2 indicates the waveform of the oscillation signal VOSC, and C3 indicates the waveform of the oscillation signal VOUT. C4 indicates the power consumption of the integrated circuit 2, C5 indicates the temperature of the integrated circuit 2 and the temperature of the resonator 3, and C6 indicates the frequency deviation of the oscillation frequency. In C5, the solid line represents the temperature change of the integrated circuit 2, and the broken line represents the temperature change of the resonator 3.

As illustrated by C1 in FIG. 14, when the supply of the power supply voltage to the VDD terminal is started at time t0, the resonator 3 oscillates and the amplitude of the oscillation signal VOSC gradually increases, as indicated by C2. When the amplitude of the oscillation signal VOSC becomes larger than the threshold value, the oscillation signal VOUT is generated at time t1, as indicated by C3. Thereafter, the supply of the power supply voltage to the VDD terminal is completed at time t4, and the operation of the oscillator 1 is stopped.

In the oscillator 1 of the second embodiment, the current flows through the heat generating circuit 21 to generate heat in the first period P1, and no current flows in the second period P2 after the first period P1 ends. In this embodiment, the length of the first period P1 can be adjusted, as indicated by C4. Although the output circuit 30 stops operating in the first period P1 and operates in the second period P2, in this embodiment, the power consumed by the heat generating circuit 21 per unit time in the first period P1 is larger than the power consumed by the output circuit 30 per unit time in the second period P2. Accordingly, as indicated by C4, the consumption current I2 in the first period P1 is larger than the consumption current I1 in the second period P2. As a result, the integrated circuit 2 generates heat with a first heat generation amount per unit time in the first period P1, generates heat with a second heat generation amount per unit time in the second period P2 after the first period P1 ends, and the first heat generation amount is larger than the second heat generation amount. For that reason, in the first period P1, the temperature of the integrated circuit 2 rises sharply, and the temperature of the resonator 3 also rises sharply following the temperature of the integrated circuit 2. Then, at time t2 of the second period P2, the integrated circuit 2 and the resonator 3 reach a thermal equilibrium state and the deviation of the oscillation frequency becomes substantially zero, as indicated by C6. As such, according to the oscillator 1 of the third embodiment, similarly as in the first embodiment, the time until the integrated circuit 2 and the resonator 3 reach the thermal equilibrium state is shortened compared to the oscillator of the comparative example described above. Furthermore, according to the oscillator 1 of the third embodiment, since the length of the first period P1 during which the temperature of the integrated circuit 2 rises sharply can be adjusted according to the individual difference of the oscillator 1, even if there is an individual difference of the oscillator 1, the time until the integrated circuit 2 and the resonator 3 reach a thermal equilibrium state can be reliably shortened.

1-4. Modification Example

The second embodiment and third embodiment described above may be combined. That is, in the oscillator 1, both the length of the first period P1 and the current flowing through the heat generating circuit 21 in the first period P1 may be variable.

In the third embodiment, although the first period P1 ends when the time set according to the heat generation period adjustment data TADJ elapses from the timing when the detection signal VDET changes from the low level to the high level, the first period P1 may end when a time set according to the heat generation period adjustment data TADJ elapses immediately after the oscillator 1 is started. For example, the heat generation period control circuit 92 counts the number of pulses of the oscillation signal VOSC immediately after the oscillator 1 is started, and may end the first period P1 by changing the heat generation control signal HTCTL from the low level to the high level when the count value corresponding to the heat generation period adjustment data TADJ is reached.

In each of the embodiments described above, although the heat generating circuit 21 is used in both the first period P1 and at the time of adjusting the temperature compensation circuit 40, a heat generating circuit that generates heat during the first period P1 and a heat generating circuit that generates heat during adjustment of the temperature compensation circuit 40 may be provided separately.

In each of the embodiments described above, although the heat generating circuit 21 generates heat when the first period P1 and the temperature compensation circuit 40 are adjusted, the present disclosure can also be applied to an oscillator that does not generate heat when the temperature compensation circuit 40 is adjusted.

In each of the embodiments described above, although the integrated circuit 2 includes the heat generating circuit 21, an element having a heater function such as a Peltier element may be provided instead of the heat generating circuit 21 or together with the heat generating circuit 21, and the element may generate heat in the first period P1.

The oscillator 1 of each of the above embodiments is an oscillator including a temperature compensation function such as a voltage controlled temperature compensated crystal oscillator (TCXO), but may be an oscillator having a temperature compensation function and a frequency control function such as a voltage controlled temperature compensated crystal oscillator (VC-TCXO).

2. Electronic Device

Figure 15:
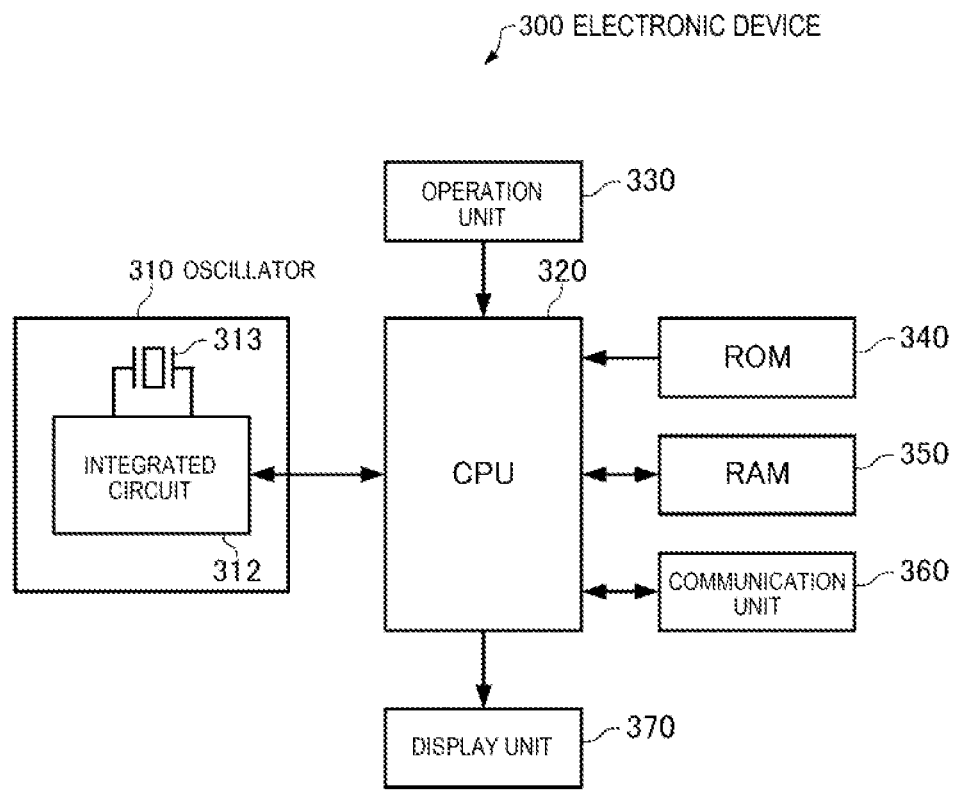
FIG. 15 is a functional block diagram of an electronic device according to the embodiment of the present disclosure.
Figure 16:
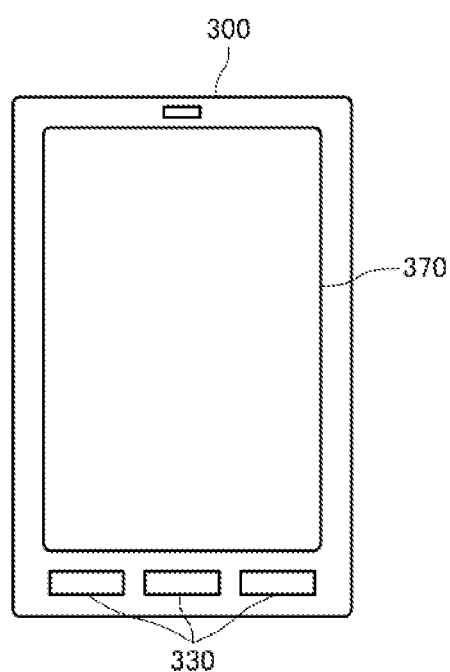
FIG. 16 is a diagram illustrating an example of an appearance of the electronic device according to the embodiment of the present disclosure.

FIG. 15 is a functional block diagram illustrating an example of a configuration of an electronic device of the embodiment of the present disclosure. FIG. 16 is a diagram illustrating an example of the appearance of a smartphone that is an example of an electronic device of the embodiment of the present disclosure.

An electronic device 300 according to the embodiment of the present disclosure is configured to include an oscillator 310, a central processing unit (CPU) 320, an operation unit 330, a read only memory (ROM) 340, a random access memory (RAM) 350, a communication unit 360, and a display unit 370. The electronic device of the embodiment of the present disclosure may have a configuration in which some of constitutional elements in FIG. 15 are omitted or changed, or other constitutional elements are added.

An oscillator 310 includes an integrated circuit 312 and a resonator 313. The integrated circuit 312 oscillates the resonator 313 and generates an oscillation signal. The oscillation signal is output from an external terminal of the oscillator 310 to the CPU 320.

The CPU 320 is a processing unit that performs various calculation processing and control processing using an oscillation signal input from the oscillator 310 as a clock signal in accordance with a program stored in the ROM 340 or the like. Specifically, the CPU 320 performs various processing according to operation signals from the operation unit 330, processing for controlling the communication unit 360 to perform data communication with an external device, and processing for transmitting a display signal for displaying various types of information on the display unit 370, and the like.

The operation unit 330 is an input device including operation keys, button switches, and the like, and outputs an operation signal corresponding to an operation by a user to the CPU 320.

The ROM 340 is a storage unit that stores programs, data, and the like for the CPU 320 to perform various calculation processing and control processing.

The RAM 350 is used as a work area of the CPU 320, and is a storage unit that temporarily stores programs and data read from the ROM 340, data input from the operation unit 330, operation results executed by the CPU 320 according to various programs, and the like.

The communication unit 360 performs various controls for establishing data communication between the CPU 320 and the external device.

The display unit 370 is a display device configured by a liquid crystal display (LCD) or the like, and displays various types of information based on the display signal input from the CPU 320. The display unit 370 may be provided with a touch panel that functions as the operation unit 330.

By applying, for example, the oscillator 1 of each embodiment described above as the oscillator 310 the frequency deviation of the oscillation signal at the time of start can be reduced, so that a highly reliable electronic device can be realized.

Various electronic devices are conceivable as such an electronic device 300, and examples thereof include a personal computer such as a mobile-type computer, a laptop-type computer, and a tablet-type computer, a mobile terminal such as a smartphone and a mobile phone, a digital camera, an ink jet ejection device such as an ink jet printer, a storage area network device such as a router and a switch, local area network equipment, mobile terminal base station equipment, a TV, a video camera, a video recorder, a car navigation device, a real-time clock device, a pager, an electronic notebook, an electronic dictionary, a calculator, an electronic game device, a game controller, a word processor, a workstation, a video phone, a crime prevention TV monitor, electronic binoculars, a POS terminal, medical equipment such as an electronic thermometer, a blood pressure monitor, a blood glucose meter, an electrocardiogram measuring device, an ultrasonic diagnostic device, and an electronic endoscope, a fish finder, various measuring instruments, instruments for a vehicle, an aircraft, a ship, and the like, a flight simulator, a head mounted display, a motion tracing device, a motion tracking device, a motion controller, and a pedestrian dead reckoning (PDR) device.

As an example of the electronic device 300 of the embodiment of the present disclosure, a transmission apparatus that functions as a terminal base station apparatus or the like that performs communication with a terminal in a wired or wireless manner using the oscillator 310 described above as a reference signal source may be included. As the oscillator 310, for example, by applying the oscillator 1 of each of the embodiments described above, it is also possible to realize the electronic device 300 that can be used for, for example, a communication base station and that is desired to have high frequency accuracy, high performance, and high reliability at a lower cost than in the past.

Another example of the electronic device 300 according to the embodiment of the present disclosure may be a communication apparatus including a frequency control unit in which the communication unit 360 receives an external clock signal and the CPU 320 controls the frequency of the oscillator 310 based on the external clock signal and an output signal of the oscillator 310. The communication apparatus may be, for example, a backbone network device such as Stratum 3 or a communication device used for a femtocell.

3. Vehicle

Figure 17:
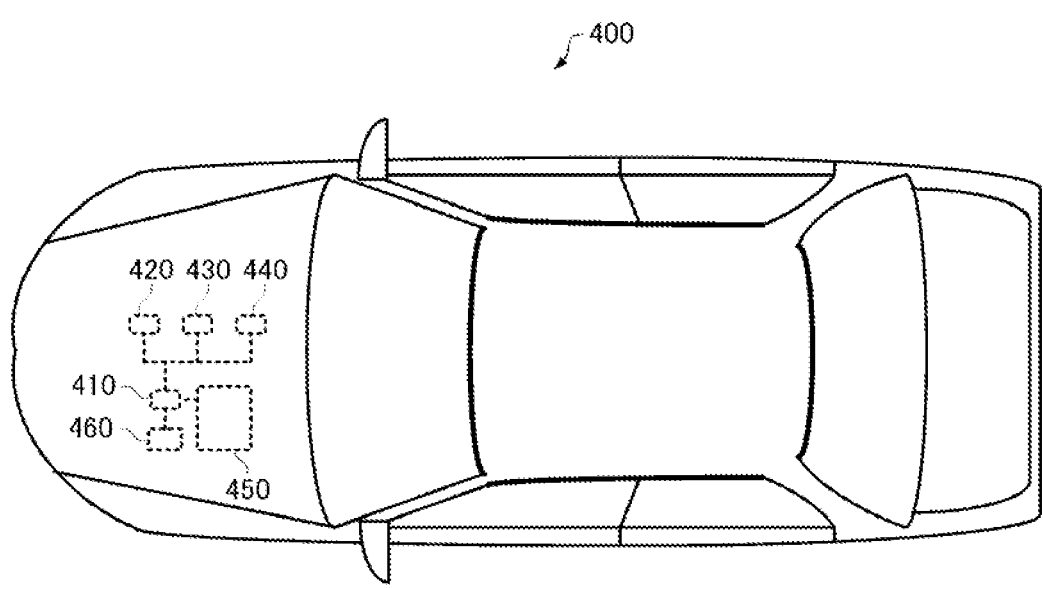
FIG. 17 is a diagram illustrating an example of a vehicle according to the embodiment of the present disclosure.

FIG. 17 is a diagram illustrating an example of a vehicle according to the embodiment of the present disclosure. A vehicle 400 illustrated in FIG. 17 is configured to include an oscillator 410, controllers 420, 430, and 440 that perform various controls for an engine system, a brake system, a keyless entry system, and the like, a battery 450, and a backup battery 460. The vehicle according to the embodiment of the present disclosure may have a configuration in which some of the constitutional elements in FIG. 17 are omitted or other components are added.

The oscillator 410 includes an integrated circuit (not illustrated) and a resonator, and the integrated circuit oscillates the resonator and generates an oscillation signal. This oscillation signal is output from the external terminal of the oscillator 410 to the controllers 420, 430, and 440 and used as, for example, a clock signal.

The battery 450 supplies power to the oscillator 410 and the controllers 420, 430, and 440. The backup battery 460 supplies power to the oscillator 410 and the controllers 420, 430, and 440 when an output voltage of the battery 450 falls below a threshold value.

By applying, for example, the oscillator 1 of each of embodiment described above as the oscillator 410, the frequency deviation of the oscillation signal at the time of start can be reduced, so that a highly reliable vehicle can be realized.

As such a vehicle 400, various vehicles are conceivable, and examples thereof may include automobiles such as electric cars, airplanes such as jets and helicopters, ships, rockets, and artificial satellites.

The present disclosure is not limited to the embodiment of the present disclosure, and various modification examples may be made thereto within the scope of the gist of the present disclosure.

The embodiments and modification example described above are merely examples, and the present disclosure is not limited thereto. For example, it is possible to appropriately combine each embodiment and each modification example.

The present disclosure includes configurations that are substantially the same as the configurations described in the embodiments, for example, configurations that have the same functions, methods, and results, or configurations that have the same purposes and effects. The present disclosure includes a configuration in which a non-essential part of the configuration described in the embodiment is replaced. The present disclosure includes a configuration that exhibits the same operational effects as the configuration described in the embodiment or a configuration that can achieve the same object. The present disclosure includes a configuration in which a known technique is added to the configuration described in the embodiment.

What is claimed is:

1. An oscillator comprising:
a resonator; and
an integrated circuit, wherein
the integrated circuit includes
an oscillation circuit that oscillates the resonator,
a temperature sensor,
a temperature compensation circuit that compensates for temperature characteristics of the resonator based on an output signal of the temperature sensor,
an output circuit that receives a signal output from the oscillation circuit and outputs an oscillation signal, and
a heat generating circuit, and
in the heat generating circuit, a current flows to generate heat in a first period that starts when supply of a power supply voltage from the outside is started, and no current flows in a second period after the first period ends,
wherein the output circuit stops operating in the first period and operates in the second period, and
power consumed by the heat generating circuit per unit time in the first period is larger than power consumed by the output circuit per unit time in the second period.

2. The oscillator according to claim 1, wherein the current flowing through the heat generating circuit in the first period is variable.

3. The oscillator according to claim 1, wherein a length of the first period is variable.

4. The oscillator according to claim 1, wherein the integrated circuit includes an amplitude detection circuit that detects an amplitude of the signal output from the oscillation circuit and outputs a detection signal, and
the first period is set based on the detection signal.

5. An electronic device comprising:
the oscillator according to claim 1.

6. A vehicle comprising:
the oscillator according to claim 1.

7. An oscillator comprising:
a resonator; and
an integrated circuit, wherein
the integrated circuit includes
an oscillation circuit that oscillates the resonator,
a temperature sensor,
a temperature compensation circuit that compensates for temperature characteristics of the resonator based on an output signal of the temperature sensor,
an output circuit that receives a signal output from the oscillation circuit and outputs an oscillation signal, and
a heat generating circuit, and
in the heat generating circuit, a current flows to generate heat in a first period that starts when supply of a power supply voltage from the outside is started, and no current flows in a second period after the first period ends,
wherein the integrated circuit includes a plurality of external connection terminals including a first external connection terminal electrically coupled to one end of the resonator and a second external connection terminal electrically coupled to the other end of the resonator, and
among the plurality of external connection terminals, the first external connection terminal or the second external connection terminal is closest to the heat generating circuit.

8. The oscillator according to claim 7, wherein among the plurality of external connection terminals, the first external connection terminal or the second external connection terminal is farthest from the temperature sensor.

9. An oscillator comprising:
a resonator; and
an integrated circuit,
wherein the integrated circuit generates heat with a first heat generation amount per unit time in a first period after supply of a power supply voltage from the outside is started, and generates heat with a second heat generation amount per unit time in a second period after the first period ends,
wherein the first heat generation amount is larger than the second heat generation amount, and
wherein an output circuit of the integrated circuit stops operating in the first period and operates in the second period, and power consumed by a heat generating circuit of the integrated circuit per unit time in the first period is larger than power consumed by the output circuit per unit time in the second period.

* * * * *